(12) United States Patent
Bohlmark et al.

(10) Patent No.: US 9,587,305 B2
(45) Date of Patent: Mar. 7, 2017

(54) CATHODIC ARC DEPOSITION

(75) Inventors: Johan Bohlmark, Stockholm (SE);
Hermann Curtins, Grenchen (CH);
Axel Kinell, Bandhagen (SE)

(73) Assignee: Lamina Technologies S.A.,
Yverdon-les-Bains (CH)

( * ) Notice: Subject to any disclaimer, the term of this patent is extended or adjusted under 35 U.S.C. 154(b) by 285 days.

(21) Appl. No.: 14/129,395

(22) PCT Filed: Jun. 28, 2012

(86) PCT No.: PCT/EP2012/062540
§ 371 (c)(1),
(2), (4) Date: Jul. 1, 2014

(87) PCT Pub. No.: WO2013/000990
PCT Pub. Date: Jan. 3, 2013

(65) Prior Publication Data
US 2015/0034478 A1 Feb. 5, 2015

(30) Foreign Application Priority Data
Jun. 30, 2011 (EP) .................................. 11005342

(51) Int. Cl.
| C23C 14/00 | (2006.01) |
| C23C 14/32 | (2006.01) |
| C23C 14/06 | (2006.01) |
| C23C 14/52 | (2006.01) |
| H01J 37/34 | (2006.01) |

(52) U.S. Cl.
CPC ........ *C23C 14/325* (2013.01); *C23C 14/0641* (2013.01); *C23C 14/52* (2013.01); *H01J 37/34* (2013.01); *H01J 37/3414* (2013.01); *H01J 37/3476* (2013.01)

(58) Field of Classification Search
CPC .................................................. C23C 14/325
See application file for complete search history.

(56) References Cited

U.S. PATENT DOCUMENTS

| 5,306,407 A | * 4/1994 | Hauzer | ................. C23C 14/022 |
| | | | 204/192.16 |
| 5,380,421 A | 1/1995 | Gorokhovsky | |
| 6,033,768 A | 3/2000 | Muenz et al. | |
| 6,139,964 A | 10/2000 | Sathrum et al. | |

(Continued)

FOREIGN PATENT DOCUMENTS

| CA | 2601722 | 9/2006 |
| JP | 2000080466 | 3/2000 |
| JP | 2008031557 | 2/2008 |

*Primary Examiner* — Keith Hendricks
*Assistant Examiner* — Timon Wanga
(74) *Attorney, Agent, or Firm* — K&L Gates LLP

(57) ABSTRACT

The present invention provides a method for depositing a wear resistant coating on a cutting tool substrate. Cathodic arc deposition is performed using one or more plate-shaped targets and a high arc current of at least 200 A, preferably at least 400 A, whereby a high total ion current of at least 5 A is provided in front of the substrates. A comparatively low bias voltage may be used in order to avoid negative effects of ions impinging on the substrates with high kinetic energy. Thanks to the method of the invention it is possible to deposit thick wear resistant coatings on cutting tool substrates in order to improve cutting performance and tool life.

15 Claims, 6 Drawing Sheets

(56) References Cited

U.S. PATENT DOCUMENTS

| | | | |
|---|---|---|---|
| 6,602,390 B1 | 8/2003 | Braendle et al. | |
| 6,645,354 B1 * | 11/2003 | Gorokhovsky | C23C 14/0605 |
| | | | 204/192.38 |
| 7,541,101 B2 | 6/2009 | Weber | |
| 2004/0154919 A1 | 8/2004 | Curtins | |
| 2007/0254173 A1 * | 11/2007 | Wallgram | B24C 1/06 |
| | | | 428/469 |
| 2009/0148599 A1 * | 6/2009 | Ramm | C23C 14/325 |
| | | | 427/255.5 |
| 2010/0051445 A1 * | 3/2010 | Vetter | H01J 37/34 |
| | | | 204/192.12 |
| 2010/0061812 A1 | 3/2010 | Ljungberg | |

* cited by examiner

CATHODIC ARC DEPOSITION

CROSS REFERENCE TO RELATED APPLICATIONS

The present application is a National Stage of International Application No. PCT/EP2012/062540, filed on Jun. 28, 2012, which claims priority to European Patent Application No. 11005342.8, filed Jun. 30, 2011, the entire contents of which are being incorporated herein by reference.

TECHNICAL FIELD

The present invention relates to a method for depositing a coating on a cutting tool substrate using a cathodic arc deposition process and in particular a high-current cathodic arc deposition process in order to form a coated cutting tool.

BACKGROUND

Most cutting tools for turning, milling, drilling or other chip forming machining are today coated with a wear resistant coating deposited using chemical vapor deposition (CVD) or physical vapor deposition (PVD) techniques in order to prolong the service life of the tool and/or to increase the productivity. In general a comparatively thick coating is aimed for since this improves the wear resistance. This is readily accomplished for CVD coatings. However, PVD coatings have several attractive properties compared to CVD coatings, in particular the ability to provide compressive stress in the coating which gives improved toughness as compared to the CVD coatings. These compressive stresses essentially originate from differences in thermal expansion between substrate and coating and a densification effect due to a bombardment of high energy ions during deposition. This advantageous effect of ion bombardment is hardly present in all PVD techniques such as thermal evaporation, but prevails in sputter deposition and with cathodic arc deposition the compressive stress may become excessively high, often greater than 5 GPa, due to high kinetic energy of impinging ions. Biasing of the substrate is a standard way of increasing the kinetic energy and is for hard coatings considered necessary to obtain desired mechanical properties. The densification typically leads to increased hardness and improved wear resistance of the coating material. In combination with a potentially high deposition rate this makes the cathodic arc deposition techniques an interesting alternative for deposition of coatings for cutting tools.

However, due to too heavy ion bombardment defects may be generated and too high compressive stresses will eventually cause delamination of the coating, spontaneously or due to forces acting on the coating during machining, in particular for thick coatings. Thus the stress level in the coating is normally controlled to obtain highest possible compressive stress without impairing the adhesion of the coating too much. In particular flaking along the edge of a coated cutting tool insert is a well known problem. For example, U.S. Pat. No. 7,838,132 discloses cathodic arc deposition of about 3 µm thick (Ti,Al)N coatings on cemented carbide substrates using an arc current of 200 A at different substrate bias ranging from −40 V to −200 V and concludes that there is an optimum at about −70 V where high compressive stresses, i.e. more than 4 GPa, and still good adhesion can be achieved.

Consequently, prior art cathodic arc deposition processes suffer from a trade-off between coating thickness, which is crucial for wear resistance, and quality of the coating with respect to mechanical properties, in particular toughness.

SUMMARY OF THE INVENTION

One object of the invention is to provide a cathodic arc deposition process that enables thick PVD coatings on cutting tools, such as coated cutting tool inserts made of cemented carbides, cermets, high speed steel, cubic boron nitride and polycrystalline diamond, in order to improve wear resistance, without deteriorating other properties such as adhesion or flaking resistance. This is accomplished by a method as defined by the independent claims.

A method for cathodic arc deposition of a coating on a cutting tool substrate within a vacuum chamber in accordance with one embodiment of the invention comprises generating a plasma from an arc discharge visible as one or more arc spots on a surface of a plate-shaped target by applying an arc current of at least 200 A between the plate-shaped target, which acts as cathode, and an anode arrangement such that ions of the arc discharge are emitted out from the plate-shaped target to form the coating on the cutting tool substrate.

In accordance with one embodiment of the invention, it has been found that an ion current density at the surface of the substrate to be coated is of significant importance for the properties of the coating. One measure of the ion current density is the total ion current produced by one or more plate-shaped targets. The total ion current can be estimated by measuring the ion current density with a probe surface negatively biased relative a voltage potential of the anode arrangement and facing the plate-shaped target at a distance of 15 cm from the target surface, and multiplying the measured ion current density with the total surface area of the plate-shaped target. Preferably, an ion current, determined as a mean ion current density along a normal direction of the target surface at the centre of the plate-shaped target, measured using a probe surface facing the target at a distance of 15 cm from the target surface, multiplied with the total surface area of the plate-shaped target is at least 5 A.

Such high total ion current density is not readily accomplished using a small target since the power density of the arc typically becomes be too high to be able to efficiently control the evaporation of target material and hence an unacceptable number of droplets would be emitted from the target surface, which is detrimental to the coating quality. By using a comparatively large target surface area, current density and local thermal load on the target can be kept at moderate levels, while providing the high total ion current.

In one embodiment of the invention the surface area of the plate-shaped target is larger than 500 cm$^2$, preferably larger than 1000 cm$^2$. Thereby a branching of the arc discharge into a multitude of arc spots distributed over substantially the whole surface area of the target is possible. The branching is promoted by the high arc current. One advantage of the branching is that it gives a comparatively uniform ion current density in the plasma over the whole surface area of the target. This can be observed as a substantially uniform illumination of the target surface during deposition. Another advantage of the branching is that it enables improved target utilization. Yet another advantage is that it is possible to obtain uniform deposition conditions in the whole vacuum chamber and hence uniform coating thickness and properties within a batch of substrates to be coated.

In one embodiment of the invention the measured ion current density, which is measured at saturation conditions of the current, is larger than 6 mA/cm$^2$, preferably larger than 10 mA/cm$^2$, and more preferably between 6 mA/cm$^2$ to 16 mA/cm$^2$ in order to obtain the high total ion current and to get a high ion flux at the cutting tool substrates. Additional plate-shaped targets may be provided, e.g. to further increase ion current supplied to the plasma formed, or to provide plate-shaped targets with different composition.

In a method in accordance with one embodiment of the invention the method further comprises applying a voltage potential difference between the substrate and the plate-shaped target, i.e. a bias voltage $V_S$ to the cutting tool substrate being negative relative a voltage potential $V_A$ of the anode arrangement and a cathode voltage $V_C$ being negative relative the voltage potential $V_A$ of the anode arrangement. As mentioned above, this is known to have an effect on the stress state of the coating, and commonly high bias voltage levels are used to obtain high compressive stresses. However, in accordance with one embodiment of the invention it has been found that the objectives of the present invention may be accomplished if the substrate is biased at a comparatively low bias level. Preferably voltage differences are $V_S-V_A > -30V$, $-20\ V < V_C-V_A < 0\ V$, and $-10\ V \leq V_S - V_C \leq 10V$. For the purpose of this application the bias voltage $V_S$ is intended to be a peak voltage.

Ions impinging on the cutting tool substrate will due to the comparatively low voltage biasing of the substrate have a moderate kinetic energy, contrary to the above-mentioned prevalent strive to increase the kinetic energy of the ions in order to increase ion mobility and thereby improve mechanical properties. However, due to the high ion current density a high ion flux is provided at the surface of the cutting tool substrate such that the total energy transferred from ions arriving at the substrate surface is still high thereby enhancing ion mobility at the surface which improves the mechanical properties without introducing detrimental high stress levels and/or defects in the coating. Thereby the stress state in the coating can be efficiently controlled.

By increasing the arc current the total ion current increases and the deposition rate increases. The increase of the current also promotes branching of the arc discharge. Preferably the arc current that generates the arc plasma is at least 400 A per plate-shaped target. In one embodiment of the invention the arc current is at least 800 A. In another embodiment the arc current is 400-1200 A.

A deposition system in accordance with one embodiment of the invention comprises an anode arrangement comprising an anode member with an anode surface directed towards the plate-shaped target and arranged concentrically with each plate-shaped target and extending laterally along a rim thereof. The large anode surface is provided close to the target and the anode surface area is fairly constant along the whole length of the plate-shaped target in order to provide uniform plasma conditions along the whole length, irrespective of conditions elsewhere in the vacuum chamber. The anode member is preferably substantially interrupted in a section of the rim extending at least partly along the width of the target on each side of the plate-shaped target in the end portions thereof in order to tailor the shape and size of the anode surface such that the plasma conditions are uniform also in the end portions. In one embodiment of the invention the anode member further comprises an anode surface that tapers outwards as the anode member extends away from the plate-shaped target in the normal direction thereof.

The anode member may further serve to contribute to a balanced electromagnetic field over the whole plate-shaped target. This total electromagnetic field is further influenced by a magnetic self-field originating from the arc current, a magnetic field originating from the means for generating a magnetic field, and a magnetic field originating from current mating of the plate-shaped target. One advantage with the balanced electromagnetic field is that the erosion of the plate-shaped targets becomes more uniform and the target utilization is improved as compared to conventional deposition systems, in particular for high arc currents above 200 A.

In one embodiment of the invention the deposition system comprises means for generating a lateral magnetic field on the target surface. This lateral magnetic field can be used to steer the displacement of the arc spot(s) of the arc plasma. Preferably, the magnetic field originating from means for generating a magnetic field is moderate, preferably less than 100 Gauss, more preferably 5-40 Gauss. This results in a weak steering of the arc discharge, i.e. branches of the arc discharge, around the plate-shaped target.

In one embodiment of the method of invention the impedance, which is determined by measuring the average voltage and arc current over the anode arrangement and the plate-shaped target, is controlled to be within a predetermined range, preferably less than 0.1 Ohm, more preferably less than 0.05 Ohm, during deposition. This is accomplished at least partly by using a comparatively weak lateral magnetic field for steering the arc discharge, contrary to steered arc techniques where a strong magnetic field is used. These steered arc techniques are one conventional way to slightly increase the arc current, however not readily above 200 A, without impairing the coating properties by increased droplet formation. Likewise, with the anode-cathode configuration of the present invention and the low impedance approach the arc current can be increased to give effective multi-branching of the arc discharge and a dense plasma in order to give a high deposition rate and without impairing coating properties.

Weak magnetic steering and well-defined electrical field between anode and cathode in accordance with embodiments of the invention improve target utilization since it prevents problems associated with random arc and conventional steered arc techniques. For example, as compared to the latter the typical race track in the target is prevented due to uniform distribution of arc spots and efficient branching of the arc over the target surface.

By combining the weak magnetic steering with the anode member having a large anode surface close to the target and providing uniform plasma conditions with respect to magnetic field and geometrical arrangement of cathode surface and anode surface around the target, and in particular in the end portions of the plate-shaped target, the anode current density around the target can be kept constant, which enables higher currents and uniform erosion around the target.

By balancing of the magnetic field with respect to magnetic self-field originating from arc current, magnetic field originating from means for generating a magnetic field, and a magnetic field originating from current mating of the target over the whole surface of the plate-shaped target the erosion of the plate-shaped target transversely to a track around the plate-shaped target is more uniform. Hence, thanks to the invention it is possible to improve target utilization.

In one embodiment of the invention the method comprises continuing deposition until a thick coating has been formed. By thick coatings is for the purpose for this application meant at least 4 µm, preferably at least 6 µm, more preferably at least 10 µm, even more preferably at least 20 µm. As appreciated by one skilled in the art the deposition process can be varied to accomplish single-layered or multilayered coatings. By multilayer structure is herein meant a stack of individual layers, at least 5 up to several thousand individual layers, preferably comprising at least two repeatedly alternating individual layers having different properties with respect to e.g. composition. The repetition may be periodic or aperiodic. Contrary to the multilayer structure the single layer has substantially the same properties throughout the thickness of the single layer. Multilayer structures can be accomplished by methods known in the art, by way of example targets of different composition and rotating the substrates to be coated in front of the targets. By thicknesses is for this purpose meant the thickness on the side of the coated cutting tool, i.e. either a flank side or a rake side, which has the thickest coating. The thickness is preferably measured by light optical microscopy on polished cross sections, 0.2 mm from the edge line. For irregular surfaces, such as those on e.g. drills and end mills, the thicknesses given herein refers to the thickness measured on any reasonably flat surface or a surface having a relatively large curvature and some distance away from any edge or corner. For instance, on a drill, the measurements should be performed on the periphery. The thickness exceeds coating thicknesses of state-of-the-art coated cutting tools produced by PVD and thereby gives superior crater wear resistance while still performing as good or better with respect to flank wear and flaking.

A method of the invention may further comprise different pre-treatment or post-treatment steps.

In one embodiment of the invention the method comprises a pre-treatment comprising subjecting the substrate blasting, preferably a two-step blasting operation including a first dry blasting step to provide an edge rounding of the substrate followed by a second wet blasting step to remove residues from the dry blasting step. However, the blasting can be performed with either dry blasting or wet basting as well. The parameters for pre-treatment blasting can be varied and is well known to a person skilled in the art.

In one embodiment the coating formed by one or more of the above described steps is subjected to a post-treatment comprising blasting, alternatively shot-peening or the like. In one aspect the blasting may provide a smoother surface. In another aspect the blasting may change the stress state in the coating, e.g. increasing the compressive stresses in the coating. Both aspects may contribute to an improved performance of the coated cutting tool formed by deposition in accordance with embodiment of the invention, in particular for thick coatings. Due to a combination controlling the stress state using the deposition parameters, such as the pressure, the ion current density and the bias, and the post-treatment blasting control of the stress state of the coating can be improved which yields an unexpected good performance of the coated cutting tool.

In one embodiment the coating is subjected to wet blasting using a nozzle arranged at a distance of about 20-300 mm, preferably 40-200 mm, and an angle of about 0-90°, preferably 35-65°, relative the rake side of the substrate and 100-800 mesh particles, preferably 300-500 mesh, at a pressure of about 0.1-0.6 MPa. The duration of the wet blasting of the coating is preferably 0.5-1 minutes. Suitable particles to be used includes, however not limited to, alumina, silicon carbide and zirconia.

In blasting a blasting medium, such as alumina particles, are impinging on the substrate with high velocity, typically in an abrasive manner. As mentioned above, the blasting may be performed either under dry conditions, i.e. with the particles or the like as a powder, or wet conditions, i.e. with the particles or the like suspended in a fluid. Depending on the blasting conditions, with respect to blasting medium, pressure, angle and duration, the effect of blasting will vary. The blasting process may for example be adjusted to obtain a smooth or rough surface of the substrate. As mentioned above the blasting can also change the stress state of the as-deposited coating. As appreciated by one skilled in the art this change can be tailored by e.g. selecting particular blasting medium, duration, angle, pressure etc.

As appreciated by one skilled in the art the deposition process may comprise different plasma etching steps, prior to, during or subsequent to deposition of the compound layer or individual layers thereof. The coating formed by a method in accordance with the invention comprises at least a compound layer comprising at least one first element selected from Group 4, Group 5, Group 6 (IUPAC), Si, Al and Y, and at least one second element selected from N, B, O and C, preferably comprising a first element selected from the group of Ti, Al, Si, Zr, Ta, Nb, W, Va, Hf, Y, Cr, more preferably nitrides of said at least one first element or combinations thereof, preferably with a composition selected from the group of (Ti, Al)N, (Ti, Al, Si)N, (Ti, Si)N, (Al, Cr)N, (Ti, Al, Cr)N, and (Ti, Al, Cr, Si)N which give hard wear resistant coatings, in particular with good abrasive wear resistance.

In one embodiment of the method of the invention a (Ti,Al)N coating is produced using at least nitrogen as reactive gas in the vacuum chamber during deposition and one or more plate-shaped targets, each comprising Ti and Al as main elements. Cutting tools with (Ti,Al)N coatings of the invention exhibit improved performance due to improved wear resistance and flaking resistance, in particular for thick coatings.

Other objects, advantages and novel features of the invention will become apparent from the following detailed description of the invention when considered in conjunction with the accompanying drawings and claims.

BRIEF DESCRIPTION OF DRAWINGS

Embodiments of the invention will now be described with reference to the accompanying drawings, wherein.

DETAILED DESCRIPTION

Figure 1A:
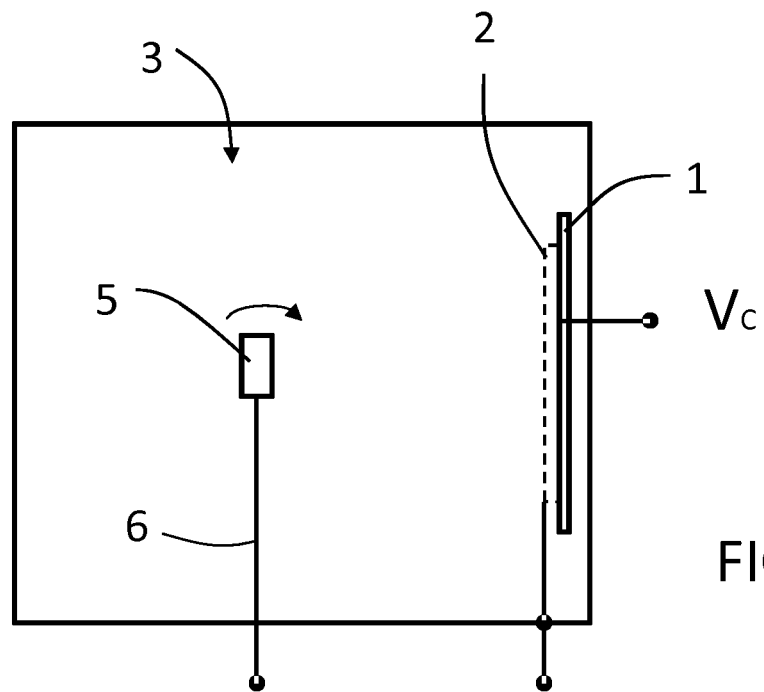
FIG. 1 is a schematic illustration of a deposition system in accordance with one embodiment of the invention.
Figure 1B:
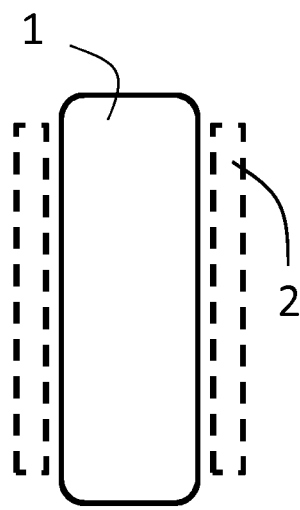

FIG. 1a schematically illustrates one example of deposition system for cathodic arc deposition in accordance with one embodiment of the invention. FIG. 1b shows front view and top view of a plate-shaped target 1 and an anode member 2. The description in the following refers to this non-limiting example, however, as appreciated by one skilled in the art, the deposition system can be modified in different ways. As in other PVD depositions systems the deposition of the coating is performed within a vacuum chamber 3 coupled to vacuum pumps (not shown) to control the pressure within the vacuum chamber 3. One or more plate-shaped targets 1 acting as sources of coating material in the deposition process are provided in or on the walls of the vacuum chamber 3 with their target surfaces facing the interior of the vacuum chamber 3. The plate-shaped targets 1 and an anode arrangement, preferably including the anode member 2, are connected to an arc power supply (not shown) and form cathode and anode of the deposition system, respectively. An arc discharge is used to evaporate target material. The arc discharge is triggered by a trigger (not shown). A cutting tool substrate 5 to be coated is carried by a fixture 6 in the vacuum chamber 3 in line-of-sight from the plate-shape targets 1. In order to uniformly coat all sides of the cutting tool substrate 5 the fixture is rotatable. The cutting tool substrates 5 are connected via the fixture 6 to a bias voltage power supply. The deposition is performed in a reactive atmosphere such that evaporated target material and a reactive gas supplied through a gas inlet into the vacuum chamber 3 react to form a compound coating.

Figure 1B:
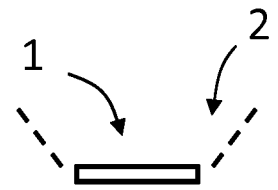

With reference to FIG. 1, a method for cathodic arc deposition of a coating on a cutting tool substrate in accordance with one embodiment of the invention comprises the steps of:
providing an anode arrangement 2 and a plate-shaped target 1 forming an anode-cathode configuration for cathodic arc deposition within a vacuum chamber 3;
providing one or more cutting tool substrates 5 in the vacuum chamber 3; and
generating a plasma from an arc discharge visible as one or more arc spots on the surface of the plate-shaped target 1 by applying an arc current of at least 200 A between the plate-shaped target 1 and the anode arrangement 2 such that ions of the arc discharge are emitted out from the plate-shaped target to form the coating on the substrate and an ion current density along a normal direction of the target surface at the centre of the plate-shaped target 1, the ion current density being measured using a plasma probe 7 with a probe surface 8 facing the plate-shaped target 1 at a distance of about 15 cm from the target surface, multiplied with the total surface area of the plate-shaped target 1 is at least 5 A.

The ion current density is measured with the plasma probe surface 8 biased at −70 V relative a voltage potential of the anode arrangement 2. At this high voltage there is no significant change in ion current density with voltage, i.e. the ion current is substantially saturated. The ion current density measurement is further explained in connection with example 14.

A method for cathodic arc deposition of a coating on a substrate in accordance with one embodiment of the invention comprises the steps of:
providing an anode arrangement 2 and a plate-shaped target 1 forming a anode-cathode configuration for cathodic arc deposition within a vacuum chamber 3 being part of a deposition system;
providing one or more cutting tool substrates 5 in the vacuum chamber 3;
generating a plasma from an arc discharge visible as one or more arc spots on the surface of the plate-shaped target 1 by applying an arc current of at least 200 A between the plate-shaped target 1 and the anode arrangement such that ions of the arc discharge are emitted out from the plate-shaped target to contribute in forming the coating the substrate; and
applying a bias voltage $V_S$ to the cutting tool substrate 5 being negative relative a voltage potential $V_A$ of the anode arrangement 2 and a cathode voltage $V_C$ being negative relative the voltage potential $V_A$ of the anode arrangement 2, wherein $V_S-V_A>-30$ V, $-20$ V$<V_C-V_A<0$ V, and $-10$ V$\leq V_S-V_C \leq 10$ V.

This embodiment can be combined with the above embodiment, i.e. then the method comprises high total ion current in combination with moderate bias level.

For the purpose of this application the bias voltage $V_S$ is intended to be a peak voltage level. The bias voltage can be provided by a bias voltage power supply. The bias voltage may be a DC voltage or a pulsed voltage. In a deposition system adapted for a pulsed bias voltage in accordance with one embodiment of the invention the bias voltage power supply comprises a pulse generating unit. The bias voltage power supply is preferably connected to a control unit that monitors the bias voltage output from the bias voltage power supply during deposition and adjusts the power supply to obtain the desired bias voltage level.

In one embodiment of the invention $V_S-V_C \leq 0$ V. In another embodiment of the invention $-19$ V$\leq V_C-V_A \leq -15$V, preferably $-18$ V$\leq V_C-V_A \leq -16$V. In yet another embodiment of the invention $-30$ V$\leq V_S-V_A \leq -15$ V, preferably $-25$ V$\leq V_S-V_A \leq -15$ V.

The arc discharge supplies ions to the plasma. One measure of the amount of ions that are supplied to the plasma is the total ion current from the plate-shaped target as defined above. With a plurality of plate-shaped targets the supply of ions can be determined by summarizing the total ion current from each of the plate-shaped targets. In one embodiment of the invention the sum of total ion currents from a respective plate-shaped target divided by the volume of the vacuum chamber is at least 3 A/m$^3$.

Preferably the arc current is a direct current supplied by a power supply connected to the deposition system. The direct current is not necessarily constant over time. Although the arc current may show considerable variation during deposition due to individual contribution from the short-lived arc discharges, this direct current should not be mixed-up with pulsed deposition techniques. Pulsed deposition can be used for the same reasons as in prior art deposition processes.

In one embodiment of the method of invention the impedance, which is determined by measuring the average voltage and arc current over the anode arrangement and the plate-shaped target, is controlled to be within a predetermined range, preferably less than 0.1 Ohm, more preferably less than 0.05 Ohm, during deposition such that the arc plasma is almost uncontrolled. This is accomplished at least partly by using a comparatively weak lateral magnetic field for steering the arc discharge, contrary to steered arc techniques where a strong magnetic field is used. These steered arc techniques are one conventional way to increase the arc current without impairing the coating properties by increased droplet formation. With the anode-cathode configuration of the present invention and the low impedance approach of this embodiment the arc current can be increased to give effective multi-branching of the arc discharge and a dense plasma in order to give a high deposition rate and without impairing coating properties. However, it should be appreciated that the impedance is not only determined by the magnetic field applied, but also other parameters such as anode placement, anode design, gas pressure, cathode design, etc. Therefore, all parameters should be considered when limiting the impedance.

To accomplish the impedance control the deposition system may comprise a control unit and an impedance monitoring unit, arranged such that the control unit based on the measurement of the impedance between the anode and the plate-shaped target by the impedance control unit adjusts the magnitude of the lateral magnetic field generated by means for generating a lateral magnetic field in order to keep the impedance within a predetermined range. The control unit may be automatically or manually controlled.

In one embodiment the method further comprises balancing magnetic self-field originating from arc current, magnetic field originating from means for generating a magnetic field, and a magnetic field originating from current mating of the target. The balancing is preferably performed by an empirical, iterative process aiming at accomplishing a uniform distribution of the arc spots over the whole surface of the plate-shaped target.

Balancing of non-uniform magnetic fields originating from the current mating can be accomplished by providing an asymmetric distribution of permanent magnets under the plate-shaped target. By way of example, a cathode arrangement of a deposition system in accordance with the invention may comprise plate-shaped target arranged on a conductive back plate. The back plate comprises at least two current bars running along the length thereof. These current bars are connected to the arc power supply in opposite ends of the plate-shaped target and current. Hence the arc current enters the current bars from opposite ends of the plate-shaped target and is spread via the current bars and the conductive back plate to the plate-shaped target. With this configuration the current density in each current bar is higher close to the current input to the current bar and is depleted towards the opposite end. Consequently the magnetic field originating from the current mating through the current bars is also decreasing along the current bar. The effect of this can be balanced using asymmetrically distributed permanent magnets arranged such that the magnetic field around the plate-shaped target becomes uniform.

In one embodiment of the invention the method further comprises providing an anode arrangement comprising an anode member arranged concentrically around said one or more plate-shaped targets. FIG. 1a schematically illustrates a side view of the anode member. FIG. 1b schematically illustrates front view and top view of the anode member and the plate-shaped target. The anode member is preferably substantially interrupted in a section extending at least partly along the width of the plate-shaped target in opposite end portions of the plate-shaped target. In one variant of this embodiment the anode member comprises an anode surface that tapers outwards as the anode member extends away from the plate-shaped target in the normal direction thereof. In many conventional systems the walls of the vacuum chamber are solely used as anodes and the anode member of the present invention can be used in combination with such configuration. The anode member is preferably on the same voltage potential as the rest of the anode arrangement, typically ground, however not limited to this.

In one embodiment of the method of the invention (Ti, Al)N coatings are deposited on cutting tool substrates using nitrogen as reactive gas in the vacuum chamber during deposition and one or more plate-shaped targets comprising Ti and Al as main elements. The composition of the plate-shaped targets and hence the composition of the plate-shaped targets may be varied to obtain different coating properties. By way of example targets consisting of 40 at-% Ti and 60 at-% Al can be used to form a $Ti_{40}Al_{60}N$ coatings or targets consisting of 60 at-% Ti and 40 at-% Al can be used to form a $Ti_{60}Al_{40}N$ coatings. The relation between Ti and Al in the coating may differ slightly from the relation in the targets. Thus the 40/60 relation above is an approximate number.

In the following examples coated cutting tools are manufactured according to embodiments of the invention and according to state-of-the-art techniques and compared with respect to crater wear, flank wear and flaking.

The coatings of Examples 1-3 and 10b and 10d were deposited using a cathodic arc deposition system comprising one or more comparatively large plate-shaped targets as described above with reference to FIG. 1. The substrate 5 to be coated is carried by a fixture 6 in line-of-sight from the plate-shape targets 1. In order to uniformly coat all sides of a substrate 5 the fixture is rotatable. The substrates 5 are connected via the fixture 6 to a bias voltage power supply. The deposition is performed in a reactive atmosphere such that evaporated target material and a reactive gas supplied through a gas inlet into the vacuum chamber 3 react to form a compound coating.

The substrates used in the examples are of three different compositions, hereinafter referred to as substrates S1, S2 and S3, respectively. These substrates are specified in Table 1.

TABLE 1

|  | S1 | S2 | S3 |
|---|---|---|---|
| Co (wt-%) | 6.0 | 7 | 10 |
| Cr (wt-%) | 0.4 | 0.7 | 0.4 |
| Ti (wt-%) | 0.06 | 0.01 |  |
| Ta (wt-%) |  | 0.01 |  |
| V (wt-%) | 0.1 |  |  |
| W (wt-%) | balance | balance | balance |
| Hc (kA/m) | 27.6 | 27.8 | 20.5 |
| HV3 (kgf/mm$^2$) | 1970 | 1890 | 1600 |

The coercivity value, Hc, was measured using a Foerster Koerzimat CS1.096 according to DIN IEC 60404-7.

EXAMPLE 1

A (Ti,Al)N coating was deposited on a S1 substrate in a nitrogen atmosphere using one plate-shaped target consisting of 40 at-% Ti and 60 at-% Al.

Prior to loading the substrate into the deposition system the substrate was subjected to dry blasting to obtain a honing to an edge radius of 30-60 μm followed by wet blasting to clean the substrate from residues from the dry blasting step. The dry blasting was performed using a nozzle with diameter 10 mm arranged at a distance of 150 mm and an angle of 45° relative the rake side of the substrate and 100 mesh alumina particles at a pressure of 0.4-0.6 MPa, i.e. the particles impinging with a 45° angle on the rake side of the substrate. The wet blasting was performed using a nozzle with diameter 9.5 mm arranged at a distance of 150 mm and an angle of 45° relative the rake side of the substrate and 360 mesh alumina particles at a pressure of 0.4 MPa. The duration of the wet blasting of the substrate was 0.5-1 minutes.

The substrate was vertically arranged, i.e. with the rake face facing the plate-shaped targets, on fixtures enabling threefold rotation in the deposition system. Prior to deposition the substrate was plasma etched by bombarding the substrates with Cr-ions in the deposition system.

The coating was deposited using the following deposition conditions: temperature 450° C., nitrogen pressure 2.5 Pa, arc current 400 A, anode voltage 0 V, bias voltage 19 V (DC), anode voltage 0 V and cathode voltage 17.5 V.

After deposition the coating was subjected to wet blasting using a nozzle with diameter 12.5 mm arranged at a distance of 50 mm and an angle of 45° relative the rake side of the substrate and 500 mesh alumina particles at a pressure of 0.4 MPa for 0.5 minutes.

The thickness of the coating was 21 μm on the flank side and 24 μm on the rake side. The hardness was 27 GPa. The internal stress after wet blasting of the coating was +90 MPa.

EXAMPLE 2

A multilayer (Ti,Al,Cr)N coating was deposited on a S1 substrate in a nitrogen atmosphere using five plate-shaped targets, each of said five plate-shape targets consisting of 40 at-% Ti and 60 at-% Al, running simultaneously with a plate-shaped target comprising 100 at-% Cr.

Prior to deposition, the substrate was subjected to pretreatment and plasma etched in accordance with Example 1, however with horizontal arrangement of the substrates, i.e. with their flank faces facing the plate-shaped targets.

The coating was deposited using the following deposition conditions: temperature 450° C., nitrogen pressure 2.5 Pa, arc current for the (Ti,Al) target 400 A, arc current for the Cr target 100 A, anode voltage 0 V, bias voltage 19 V (DC) and cathode voltage 17.5V. After deposition the coating was subjected to wet blasting using a nozzle with a diameter of 9.5 mm arranged at a distance of 150 mm and an angle of 45° relative the rake side of the substrate and 360 mesh alumina particles at a pressure of 0.4 MPa. The duration of the wet blasting of the coating was 0.5-1 minutes.

The thickness of the coating was 16 μm on the flank side and 11 μm on the rake side. The hardness was 31 GPa. The internal stress after wet blasting of the coating was −1340 MPa.

EXAMPLE 3

A TiAlN coating was deposited on a S3 substrate in a nitrogen atmosphere using three plate-shaped targets, each of said three plate-shape targets consisting of 60 at-% Ti and 40 at-% Al.

Prior to loading the substrate into the deposition system the substrate was subjected to dry blasting to obtain a honing to an edge radius of 30-60 μm followed by wet blasting to clean the substrate from residues from the dry blasting step. The dry blasting was performed using a nozzle with a diameter of 10 mm arranged at a distance of 150 mm and an angle of 45° relative the rake side of the substrate and 100 mesh alumina particles at a pressure of about 0.4-0.6 MPa. The wet blasting was performed using a nozzle with a diameter of 12.5 mm arranged at a distance of 50 mm and an angle of 45° relative the rake side of the substrate and 500 mesh alumina particles at a pressure of about 0.4 MPa for 0.5 minutes.

Prior to deposition, the substrate was horizontally arranged and plasma etched in accordance with Example 1. The coating was deposited using the following deposition conditions: temperature 450° C., nitrogen pressure 3.5 Pa, arc current 400 A, anode voltage 0V, bias voltage 20.5 V (pulsed bias, 80% duty cycle) and cathode voltage 17.5 V.

After deposition the coating was subjected to wet blasting using a nozzle with a diameter of 12.5 mm arranged at a distance of 50 mm and an angle of 45° relative the rake side of the substrate and 500 mesh alumina particles at a pressure of 0.4 MPa for 0.5 minutes.

The thickness of the coating was 23 μm on the flank side and 15 μm on the rake side. The internal stress was +900 MPa after deposition, prior to blasting. The internal stress after blasting of the coating was −1585 MPa. The hardness of the coating was 26 GPa.

EXAMPLE 4

A single layer of (Ti,Al)N was deposited on a S2 substrate by cathodic arc deposition in a Balzers Rapid Coating System in a nitrogen atmosphere using targets with the composition $Ti_{0.33}Al_{0.67}$. The thickness of the coating was 3 μm

EXAMPLE 5

A TiAlN multilayer coating with a TiN/(Ti,Al)N multilayer structure repeatedly alternated with a (Ti,Al)N single layer was deposited on a S2 substrate using cathodic arc deposition in a Balzers Rapid Coating System in a nitrogen atmosphere. The TiN/(Ti,Al)N multilayer structure was deposited using Ti and $Ti_{0.5}Al_{0.5}$ targets and the (Ti,Al)N single layer was deposited using $Ti_{0.5}Al_{0.5}$ targets. The coating thickness was 4 μm.

EXAMPLE 6

A commercial state-of-the-art CVD coated cutting tool for turning applications with a cemented carbide substrate and a MT-TiCN+α-$Al_2O_3$+TiN coating was used for comparison.

EXAMPLE 7

Inserts from Examples 1-6 were tested with respect to crater wear by turning in bearing steel (Ovako 825B, Tibnor). The result is presented in Table 2. Tool life criterion was crater wear exceeding 0.5 mm².

TABLE 2

|  | Example | | | | | |
| --- | --- | --- | --- | --- | --- | --- |
|  | 1 | 2 | 3 | 4 | 5 | 6 |
| Tool life (min) | n.a. | 10 | 22 | 2 | 10 | >30 |

EXAMPLE 8

Inserts from Examples 2-6 were tested with respect to flank wear by longitudinal turning in tool steel (Sverker21, Uddeholm). The result is presented in Table 3. Tool life criterion was flank wear exceeding 0.2 mm.

TABLE 3

|  | Example | | | | | |
|---|---|---|---|---|---|---|
|  | 1 | 2 | 3 | 4 | 5 | 6 |
| Tool life (min) | n.a. | 18 | 12 | 16 | 8 | 12 |

EXAMPLE 9

Inserts from the above Examples were tested with respect to flaking by turning in austenitic stainless steel (304L, Sandvik).

Figure 2:
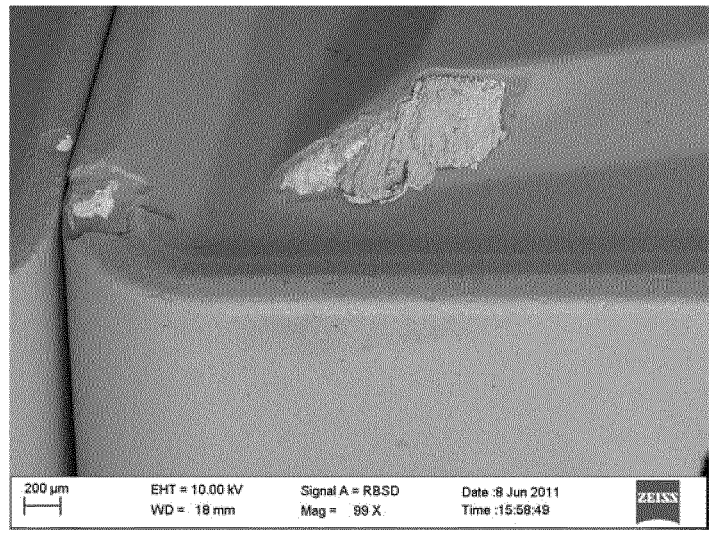
FIG. 2 is a scanning electron microscope image of a (Ti,Al)N coated cutting tool in accordance with one embodiment of the invention (Example 1) after turning in steel.
Figure 3:
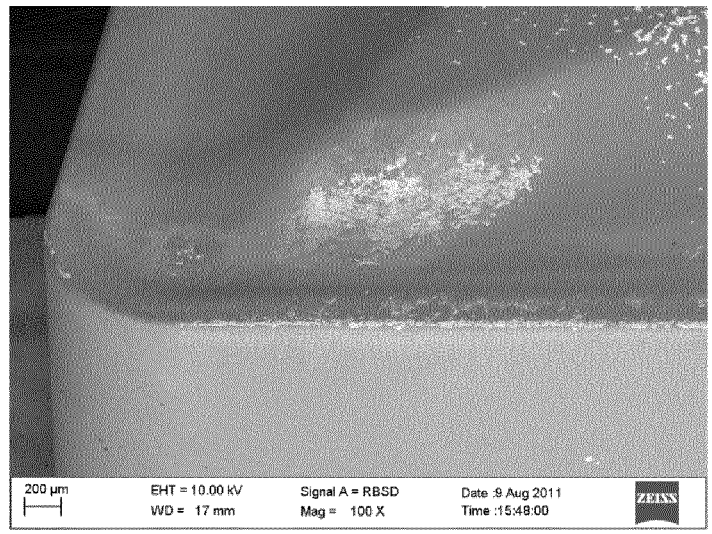
FIG. 3 is a scanning electron microscope image of a (Ti,Al)N coated cutting tool in accordance with prior art (Example 9) after turning in steel.

The extent of flaking was qualitatively determined using a scanning electron microscope (SEM). FIG. 2 and FIG. 3 are SEM images of the inserts of Example 1 and Example 5, respectively. Inserts of Example 1 in accordance with the invention do not show any flaking down to the substrate. Inserts of Example 5 in accordance with prior art show severe flaking along the cutting edge, although having much thinner coating than in Example 1.

The performance of a coated cutting tool in accordance to the invention with respect to crater wear, flank wear and flaking shown in the above Examples makes clear that the coating and the coated cutting tool manufactured in accordance with the present invention has excellent toughness and wear resistance. In particular the flaking resistance of such a thick coating is unexpected good.

EXAMPLE 10

Figure 4A:
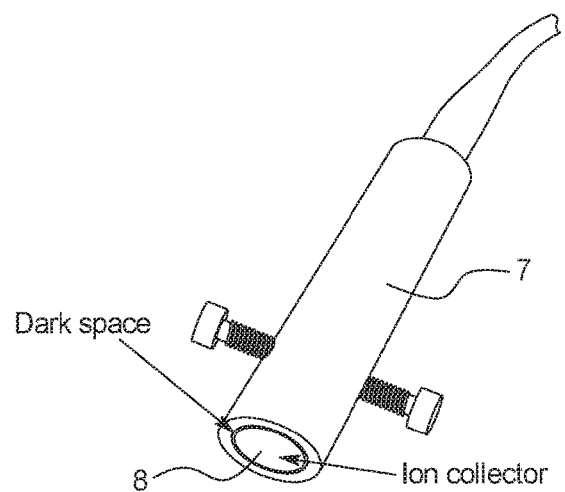
FIG. 4a is a photograph of the plasma probe used to measure ion current density, FIG. 4b schematically illustrates total ion current in front of plate-shaped targets of the invention and in front of circular targets of prior art determined from plasma probe measurements.
Figure 4B:
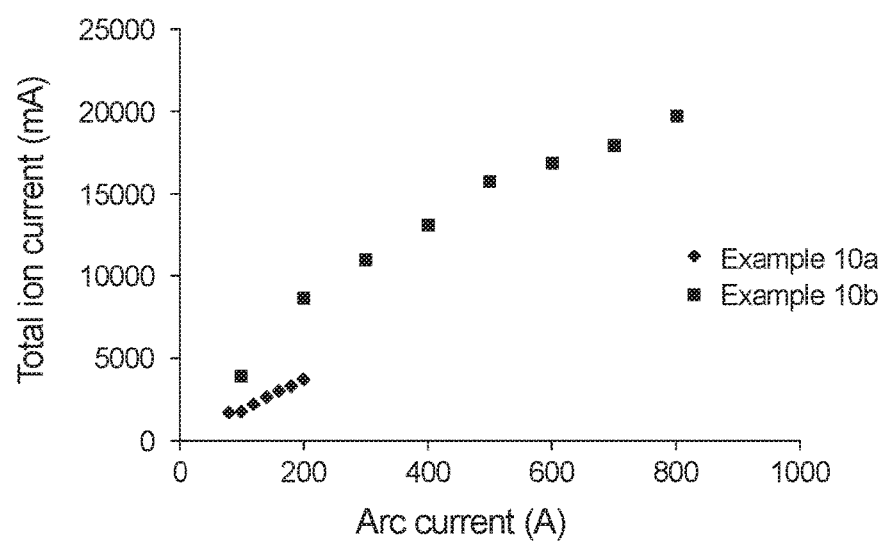

In order to evaluate the total ion current generated by a plate-shaped target in accordance with the present invention a plasma probe was used to measure the ion current density in front of a plate-shaped target. As shown in the photograph of FIG. 4a the plasma probe 7 comprises a cylinder of stainless steel connected in one end by a cable and truncated in the other end by an interior sensor element with a circular sensor surface 8 with a diameter of 1 cm and made of stainless steel. The sensor surface 8 is isolated from the cylinder and hence collects ions from one direction only. A cable in the opposite end of the cylinder connects the cable to an oscilloscope and a power supply. To perform the measurement the plasma probe 7 was placed in front of the plate-shaped target with the sensor surface 8 facing the plate-shaped target 1 at a distance of 15 cm from the centre of the target surface and the sensor surface 8 was biased at −70V via the cable. At −70 V the ion current is considered to be saturated and does not vary much with the change in bias voltage. An arc discharge was triggered and the ion current density was measured for different arc currents. This measurement was performed in a conventional deposition system (Balzers Rapid Coating System) with a Ø 16 cm $Ti_{40}Al_{60}$ plate-shaped target using arc currents of 80, 100, 120, 140, 160, 180 and 200 A, hereinafter referred to as Example 10a, and in a deposition system in accordance with the present invention with a 74×19 cm² $Ti_{40}Al_{60}$ plate-shaped target using arc currents of 100, 200, 300, 400, 500, 600, 700 and 800 A, hereinafter referred to as Example 10b. The measurements were performed in a nitrogen atmosphere at a pressure of 5 Pa and at a temperature of 250° C. and 400° C., respectively. FIG. 4b schematically illustrates the total ion current determined by multiplying the measured ion current density with target size. The ion current of the deposition system using the larger plate-shaped targets is significantly larger than in the conventional deposition system. For an arc current of 180 A the total ion current in the prior art deposition system is 3.3 kA and for an arc current of the deposition system in accordance with the invention is 8.7 kA.

EXAMPLE 11

(Ti, Al)N coatings were deposited on fine grained cemented carbide cutting tool insert substrates using conventional methods, hereinafter referred to as Example 11a and Example 11c, and methods in accordance with embodiments of the invention, hereinafter referred to as Example 11b and Example 11d.

The reference coating of Example 10a was deposited on a CNMG120408-MM S3 substrate by cathodic arc deposition using a conventional PVD production equipment (Balzers Rapid Coating System). A Ø 16 cm plate-shaped target with a $Ti_{33}Al_{67}N$ composition was used as cathode. The walls of the vacuum chamber were connected to ground and acted as an anode. Deposition was performed in a nitrogen atmosphere at a temperature of 600° C., a pressure of 1.0 Pa, an average cathode voltage of about −22 V and a DC bias voltage of −100 V relative the anode, and an arc current of about 150 A. The thickness of the coating measured on the flank side of the coated cutting tool insert was 3.5 μm.

Figure 5:
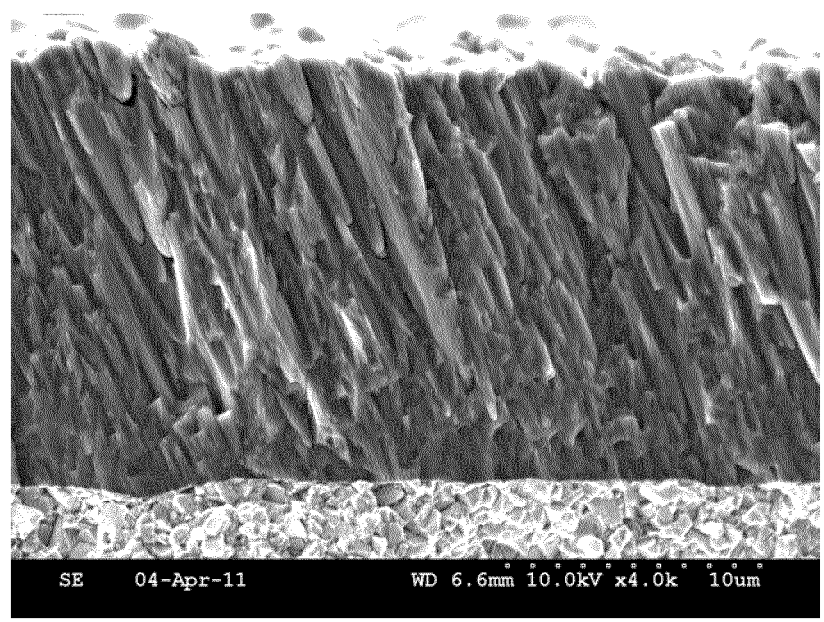
FIG. 5 is a cross-sectional view of a thick (Ti,Al)N coating deposited in accordance with one embodiment of the invention

The coating of Example 11b was deposited by cathodic arc deposition on a CNMG120408 S1 insert in a cathodic arc deposition system using a 74×19 cm² plate-shaped target with a $Ti_{40}Al_{60}N$ composition as a cathode. The vacuum chamber walls and an anode member arranged concentrically around the plate-shaped target were connected to ground and acted as an anode. Deposition was performed in a nitrogen atmosphere at a temperature of 450° C., a pressure of 3.0 Pa, a cathode voltage of −15 V and a bias voltage of −20 V relative the anode voltage, and an arc current of 400 A. The thickness of the coating measured on the flank side of the coated cutting tool insert was 17 μm. After deposition the coating was post-treated by wet sand blasting. FIG. 5 shows a cross-sectional scanning electron microscope micrograph of a coating in accordance with Example 11b.

The reference coating of Example 2c was deposited on a R390-11 S3 substrate by cathodic arc deposition using the same deposition and anode-cathode configuration as in Example 11a, but with two targets having a $Ti_{33}Al_{67}$ composition and a $Ti_{84}Al_{16}$ composition, respectively, and rotating the cutting tool substrate in front of the targets during deposition such that a multilayer coating was formed. Deposition was performed in a nitrogen atmosphere at a temperature of 600° C., a pressure of 2.5 Pa, a cathode voltage of about −22 V for the $Ti_{33}Al_{67}$ targets, about −25 V for the $Ti_{84}Al_{16}$ targets and a substrate bias voltage of −60 V relative the anode, and an arc current of about 150 A. The thickness of the coating measured on the flank side of the coated cutting tool insert was 3 μm.

The coating of Example 11d was deposited on a R245-12 S3 substrate by cathodic arc deposition using the same deposition and anode-cathode configuration as in Example 11b and with the same target composition. Deposition was performed in a nitrogen atmosphere at a temperature of 450° C., a pressure of 3.5 Pa, a cathode voltage of −17 V and a substrate bias voltage of −26 V relative the anode, and an arc current of 400 A. The thickness of the coating measured on the flank side of the coated cutting tool insert was 6 μm.

EXAMPLE 12

Figure 6A:
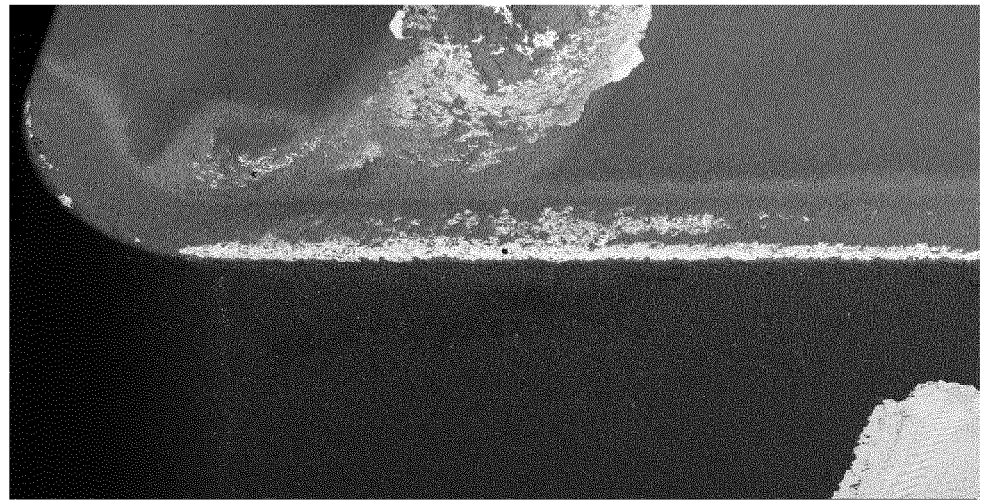
FIG. 6 is a scanning electron microscope image of a (Ti,Al)N coated cutting tool insert, (a) in accordance with prior art and (b) in accordance with one embodiment of the invention, after turning in stainless steel.
Figure 6B:
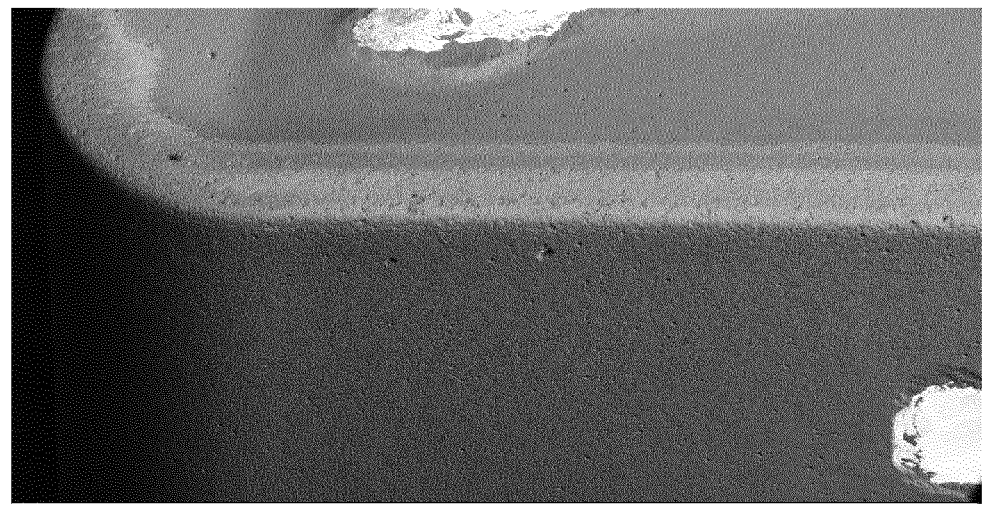

The coatings of Example 11a and 11b were tested by turning in stainless steel (304L) with coolant. FIG. 6a is a scanning electron microscope image of the coated cutting tool of Example 11a after testing. FIG. 6b is a scanning electron microscope image of the coated cutting tool of Example 11b after testing and etching. As shown in the images the coating of Example 11b is nearly unaffected and in particular there is a notable improvement with respect to flaking resistance.

EXAMPLE 13

Figure 7A:
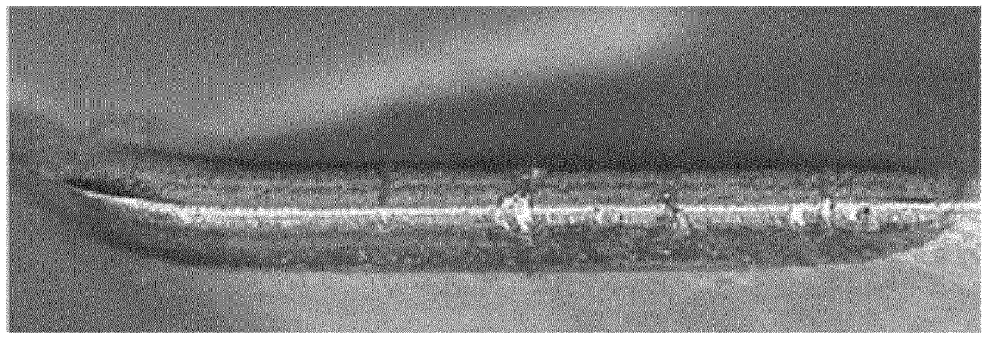
FIG. 7 is a light optical image of a (Ti,Al)N coated cutting tool insert, (a) in accordance with prior art and (b) in accordance with one embodiment of the invention, after face milling in steel.
Figure 7B:
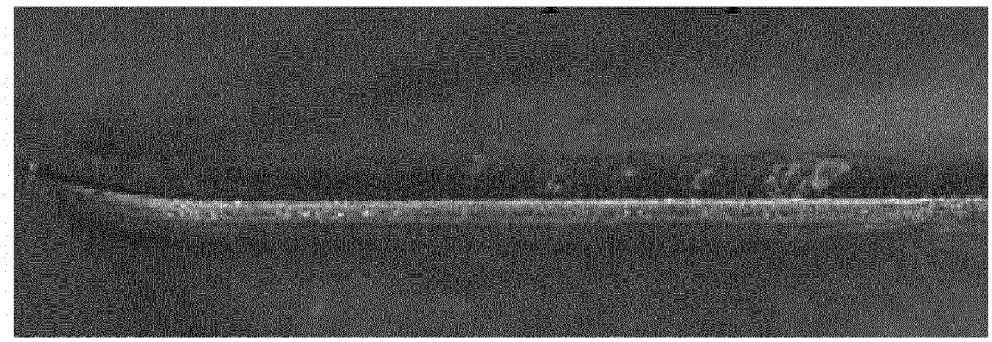

The coatings of Example 2c and Example 2d were tested using face milling in steel (ISO-P) without coolant. FIG. 7a is a light optical image of the coated cutting tool of Example 11c after testing. FIG. 7b is a light optical image of the coated cutting tool of Example 11 d after testing. The comb crack resistance is significantly better in Example 11d than in Example 11c.

Thicknesses of the deposited coatings were measured by light optical microscopy on polished cross sections. In general the thickness of the coating on the flank side of the coated cutting tool is larger than on the rake side since the inserts have been mounted with the flank side towards the plate-shaped targets. Hence the thickness was measured 0.2 mm from the edge line on each of the flank side and the rake side to reflect this difference. For irregular surfaces, such as those on e.g. drills and end mills, the thicknesses given herein refers to the thickness measured on any reasonably flat surface or a surface having a relatively large curvature and some distance away from any edge or corner. For instance, on a drill, the measurements should be performed on the periphery.

In addition to measurement of composition using EDS or the like the composition of each individual layer can be estimated from the composition of the targets. When thicker layers have been deposited, thick enough to be analysed, it has been shown that the composition of the deposited layers can differ with a few percentage compared to the composition of the target material. Hence the compositions of the coatings are not given in all of the above examples.

Internal stresses of the coatings were measured on the middle of the flank side of the coated cutting tools, more specifically by X-ray diffraction using ψ-geometry on a X-ray diffractometer Bruker D8 Discover-GADDS equipped with laser-video positioning, Euler ¼-cradle, rotating anode as X-ray source (CuK$_\alpha$-radiation) and an area detector (Hi-star). A collimator of size 0.5 mm was used to focus the beam. The analysis was performed on the TiAlN (200) reflection using the goniometer settings 2θ=50°, ω=25° and Φ=0°, 90°, 180°, 270°. Eight ψ tilts ranging from 0° to 70° were performed for each Φ-angle. The sin$^2$ ψ method was used to evaluate the internal stress using the software DIFFRAC$^{Plus}$ Stress32 v. 1.04 from Bruker AXS with the constants Young's modulus, E=450 GPa and Poisson's ratio, ν=0.20 and locating the reflection using the Pseudo-Voigt-Fit function.

Hardness of the coatings was measured using nano-indentation.

Terms like in lateral, front, top, in front of, length, width, horizontally etc. are used for illustrative purposes only and are not intended to limit the invention to a specific orientation.

Although the present invention is described in terms of cutting tool inserts it should be appreciated that the method can be applied to round tools, such as mills and drills, as well.

While the invention has been described in connection with what is presently considered to be the most practical and preferred embodiments, it is to be understood that the invention is not to be limited to the disclosed embodiments, on the contrary, it is intended to cover various modifications and equivalent arrangements within the appended claims.

The invention claimed is:

1. A method for depositing a TiAlN coating on a cutting tool substrate using a high-current cathodic arc deposition process, comprising the steps of:
providing an anode arrangement and a plate-shaped target forming an anode-cathode configuration for cathodic arc deposition within a vacuum chamber, wherein the plate-shaped target comprises Ti and Al as main elements;
providing one or more cutting tool substrates in the vacuum chamber comprising nitrogen as reactive gas;
generating a plasma from an arc discharge visible as one or more arc spots on the surface of the plate-shaped target by applying an arc current of at least 200 A between the plate-shaped target and the anode arrangement such that ions of the arc discharge are emitted out from the plate-shaped target to contribute in forming the coating on said one or more cutting tool substrates;
wherein a mean ion current density along a normal direction of the target surface is at least 5 A, wherein said mean ion current density can be measured by using a probe surface facing the target at a distance of 15 cm from the target surface, multiplied with the total surface area of the plate-shaped target; and
wherein the method further comprises applying a bias voltage $V_S$ to the cutting tool substrate being negative relative to a voltage potential $V_A$ of the anode arrangement and a cathode voltage $V_C$ being negative relative to the voltage potential $V_A$ of the anode arrangement, wherein:

$V_S - V_A > -30$ V, $-20$ V $< V_C - V_A < 0$ V, and $-10$ V $< V_S - V_C < 10$ V.

2. The method of claim 1, wherein the plate-shaped target has a surface area larger than 500 cm$^2$.

3. The method of claim 1, wherein the ion current density is larger than 6 mA/cm$^2$.

4. The method of claim 1, wherein $V_S - V_C \leq 0$ V.

5. The method of claim 1, wherein $-19$ V $< V_C - V_A < -15$ V.

6. The method of claim 1, wherein $-30$ V $< V_S - V_A \leq -15$ V.

7. The method of claim 1, wherein the arc current is ≥400 A.

8. The method of claim 1, further comprising generating a lateral magnetic field on the target surface for steering displacement of said one or more arc spots of the arc discharge.

9. The method of claim 8, further comprising controlling the magnitude of the lateral magnetic field to control the impedance measured over the plate-shaped target and the anode arrangement to be <0.1 Ohm.

10. The method of claim 8, further comprising balancing a magnetic self-field originating from the arc current, the magnetic field, and a magnetic field originating from current mating of the plate-shaped target to achieve a uniform distribution of the arc spots over the whole surface of the plate-shaped target.

11. The method of claim 8, wherein the lateral magnetic field is less than 100 Gauss.

12. The method of claim 8, further comprising providing an asymmetric distribution of permanent magnets under the target in order to balance a magnetic field originating from current mating of the plate-shaped target such that a magnetic field around the plate-shaped target is uniform.

13. The method of claim 1, wherein the coating thickness is at least 10 μm.

14. The method of claim 1, wherein the total ion current originating from all plate-shaped targets divided by an interior volume of the vacuum chamber is at least 3 $A/m^3$.

15. The method of claim 1, further comprising post-treatment of the coating after deposition by blasting.

* * * * *